US010574141B2

(12) United States Patent
Chang et al.

(10) Patent No.: US 10,574,141 B2
(45) Date of Patent: Feb. 25, 2020

(54) CURRENT MIRROR CALIBRATION CIRCUIT AND CURRENT MIRROR CALIBRATION METHOD

(71) Applicant: uPI semiconductor corp., Zhubei, Hsinchu County (TW)

(72) Inventors: Chih-Lien Chang, Zhubei (TW); Pei-Ling Hong, Zhubei (TW); Min-Rui Lai, Zhubei (TW)

(73) Assignee: UPI SEMICONDUCTOR CORP, Zhubei (TW)

( * ) Notice: Subject to any disclaimer, the term of this patent is extended or adjusted under 35 U.S.C. 154(b) by 0 days.

(21) Appl. No.: 16/296,454

(22) Filed: Mar. 8, 2019

(65) Prior Publication Data

US 2019/0296639 A1 Sep. 26, 2019

(30) Foreign Application Priority Data

Mar. 23, 2018 (TW) .............................. 107110136 A (51) Int. Cl.
*H02M 3/156* (2006.01)
*H03K 5/24* (2006.01)
*G05F 3/10* (2006.01)
*H02M 1/00* (2006.01)
*H03K 5/00* (2006.01)

(52) U.S. Cl.
CPC .............. *H02M 3/156* (2013.01); *G05F 3/10* (2013.01); *H03K 5/24* (2013.01); *H02M 2001/0025* (2013.01); *H02M 2003/1566* (2013.01); *H03K 2005/00202* (2013.01)

(58) Field of Classification Search
CPC ......... H02M 3/156; H02M 2001/0025; H02M 2003/1566; H02M 3/1584; G05F 3/10; H03K 5/24; H03K 2005/00202
See application file for complete search history.

(56) References Cited

U.S. PATENT DOCUMENTS 6,919,715 B2 7/2005 Muratov et al.
8,981,753 B2 3/2015 Giannopoulos
(Continued)

FOREIGN PATENT DOCUMENTS

CN 206442299 U 8/2017

*Primary Examiner* — Kyle J Moody
(74) *Attorney, Agent, or Firm* — McClure, Qualey & Rodack, LLP (57) ABSTRACT

A current mirror calibration circuit, coupled to an error amplifier of a pulse-width modulation controller, includes a first voltage generation unit, a second voltage generation unit, a calibration unit and a current mirror circuit. During an initial period, the first voltage generation unit and second voltage generation unit provide a first default voltage and a second default voltage respectively. The current mirror circuit includes a first current unit and a second current unit. The first current unit receives an original current. The second current unit generates a mirror current having a proportional relationship with original current. The first current unit has a first node coupled to the first voltage generation unit and a second node coupled to a third default voltage. The second current unit has a third node coupled to the second voltage generation unit and calibration unit and a fourth node coupled to calibration unit and an output terminal of error amplifier.

16 Claims, 4 Drawing Sheets

(56) References Cited

U.S. PATENT DOCUMENTS

| 9,397,564 | B2 | 7/2016 | Sahu et al. |
| 2016/0181916 | A9 | 6/2016 | Tang et al. |
| 2019/0157973 | A1* | 5/2019 | Mihashi ................ H02M 3/155 |

* cited by examiner

CURRENT MIRROR CALIBRATION CIRCUIT AND CURRENT MIRROR CALIBRATION METHOD

BACKGROUND OF THE INVENTION

1. Field of the Invention

The invention relates to power conversion; in particular, to a current mirror calibration circuit and a current mirror calibration method applied to a pulse-width modulation (PWM) controller.

2. Description of the Prior Art

In the DC-DC conversion control technology, when the load line switches from light load to heavy load (e.g., pumping), in order to prevent the load line from being damaged by the instantaneous large current, the conventional DC-DC converting controller usually provides the load line droop function.

The conventional DC-DC converting controller can replicate the input current through a current mirror disposed in the DC-DC converting controller to generate the same or related mirror current as the input current to provide the required load line droop.

However, once the current mirror in the DC-DC converting controller has an error and outputs an incorrect mirror current, the voltage drop provided by the load line droop will be incorrect and the output of the DC-DC converting controller will be also incorrect accordingly.

SUMMARY OF THE INVENTION

Therefore, the invention provides a current mirror calibration circuit and a current mirror calibration method to effectively solve the above-mentioned problems in the prior art.

An embodiment of the invention is a current mirror calibration circuit. In this embodiment, the current mirror calibration circuit is coupled to an error amplifier of a pulse-width modulation (PWM) controller. The current mirror calibration circuit includes a first voltage generation unit, a second voltage generation unit, a calibration unit and a current mirror circuit. During an initial period, the first voltage generation unit provides a first default voltage and the second voltage generation unit provides a second default voltage. The current mirror circuit includes a first current unit and a second current unit. The first current unit receives an original current. The second current unit generates a mirror current having a proportional relationship with the original current. The first current unit has a first node and a second node. The second current unit has a third node and a fourth node. The first node is coupled to the first voltage generation unit. The second node is coupled to a third default voltage. The third node is coupled to the second voltage generation unit and the calibration unit. The fourth node is coupled to the calibration unit and an output terminal of the error amplifier.

In an embodiment of the invention, the calibration unit compares the third default voltage with a reference voltage on the fourth node and adjusts the reference voltage to be equal to the third default voltage.

In an embodiment of the invention, the first default voltage is equal to the second default voltage.

In an embodiment of the invention, the current mirror circuit includes a first resistor disposed between the first node and the second node.

In an embodiment of the invention, the current mirror circuit includes an internal parameter setting unit disposed between the third node and the fourth node.

In an embodiment of the invention, the first voltage generation unit includes a first switch unit and a first voltage follower, the first switch unit is coupled to an output current pin of the PWM controller, the first voltage follower is coupled between the first node and the first switch unit.

In an embodiment of the invention, the first switch unit comprises a first switch and a second switch. The first switch is coupled between the output current pin and an input terminal of the first voltage follower. The second switch is coupled between the first default voltage and the input terminal of the first voltage follower. Operations of the first switch and the second switch are controlled by an enable signal to provide the first default voltage to the input terminal of the first voltage follower.

In an embodiment of the invention, the second voltage generation unit includes a third switch and a fourth switch. The third switch is coupled between a DC-to-AC voltage and the third node. The fourth switch is coupled between the second default voltage and the third node. Operations of the third switch and the fourth switch are controlled by an enable signal to provide the second default voltage to the third node.

In an embodiment of the invention, the calibration unit includes a comparator and a compensation unit. The comparator is coupled to the fourth node and the third default voltage and used for comparing a reference voltage on the fourth node with the third default voltage to provide a comparing result. The compensation unit is coupled to the third node, the fourth node and the comparator respectively and used for compensating the mirror current flowing through the third node and the fourth node according to the comparing result.

In an embodiment of the invention, the compensation unit includes a first current source, a fifth switch, a second current source and a sixth switch. The first current source is coupled between the first current source and the third node. The second current source is coupled to a ground terminal. The sixth switch is coupled to the second current source and the fourth node. The compensation unit controls operations of the fifth switch and the sixth switch according to the comparing result to compensate the mirror current flowing through the third node and the fourth node.

In an embodiment of the invention, when the comparing result is that the reference voltage is larger than the third default voltage, the fifth switch is turned off and the sixth switch is turned on to pump current from the fourth node; when the comparing result is that the reference voltage is smaller than the third default voltage, the fifth switch is turned on and the sixth switch is turned off to sink current to the third node.

In an embodiment of the invention, the first voltage generation unit provides the first default voltage according to an enable signal; when the enable signal is disabled, the first voltage generation unit stops providing the first default voltage.

In an embodiment of the invention, the second voltage generation unit provides the second default voltage according to an enable signal; when the enable signal is disabled, the second voltage generation unit stops providing the second default voltage.

Another embodiment of the invention is a current mirror calibration method. In this embodiment, the current mirror calibration method is used to calibrate a current mirror circuit. The current mirror circuit is coupled to an error amplifier of a pulse-width modulation (PWM) controller. The current mirror circuit includes a first current unit and a second current unit. The first current unit has a first node and a second node. The second current unit has a third node and a fourth node. The fourth node is coupled to an input terminal of the error amplifier. The current mirror calibration method includes: during an initial period, providing a first default voltage, a second default voltage and a third default voltage to the first node, the second node and the third node respectively; when the first current unit receives an original current, the second current unit generating a mirror current having a proportional relationship with the original current, and the mirror current flowing through the third node and the fourth node; and comparing the third default voltage with a reference voltage on the fourth node and adjusting the reference voltage to be equal to the third default voltage.

Compared to the prior art, during the initial period of the IC, the current mirror calibration circuit and the current mirror calibration method of the invention generate a reference voltage (e.g., the third default voltage VREF) and a reference current (e.g., the original current IO) at the input terminal of the current mirror circuit (e.g., the first current unit), generate an output voltage (e.g., the reference voltage VEAP) and an output current (e.g., the mirror current IDRP) at the output terminal of the current mirror circuit (e.g., the second current unit), and control a set of current source in the compensation unit to perform current pumping/sinking according to a comparing result between the output voltage (e.g., the reference voltage VEAP) and the reference voltage (e.g., the third default voltage VREF) until the output voltage (e.g., the reference voltage VEAP) is equal to the reference voltage (e.g., the third default voltage VREF), thereby the error caused by the current mirror circuit can be effectively eliminated to avoid providing the erroneous output voltage (e.g., the reference voltage VEAP) to the error amplifier of the PWM controller.

The advantage and spirit of the invention may be understood by the following detailed descriptions together with the appended drawings.

DETAILED DESCRIPTION OF THE INVENTION

Exemplary embodiments of the invention are referenced in detail now, and examples of the exemplary embodiments are illustrated in the drawings. Further, the same or similar reference numerals of the elements/components in the drawings and the detailed description of the invention are used on behalf of the same or similar parts.

Figure 1:
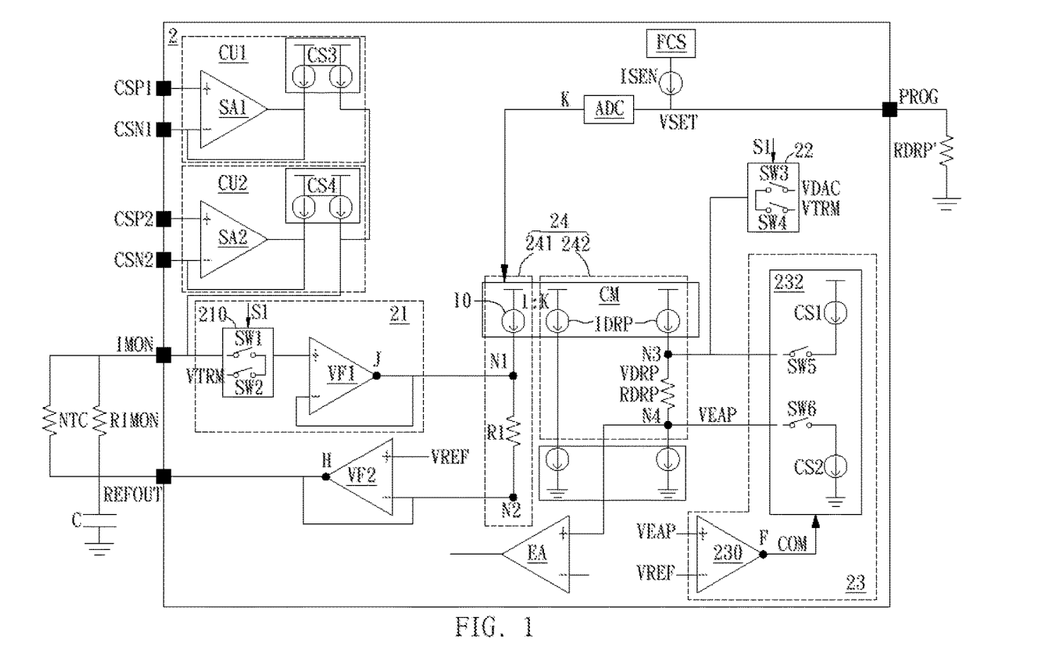
FIG. 1 illustrates a schematic diagram of the current mirror calibration circuit applied to the PWM controller 2 in an embodiment of the invention.

An embodiment of the invention is a current mirror calibration circuit. Please refer to FIG. 1. FIG. 1 illustrates a schematic diagram of the current mirror calibration circuit applied to a PWM controller 2 in this embodiment.

As shown in FIG. 1, the PWM controller 2 can include an error amplifier EA, a parameter setting pin PROG, a current output pin IMON, an output reference pin REFOUT, a first current sensing pin CSP1/CSN1, a second current sensing pin CSP2/CSN2, a first current sensing unit CU1, a second current sensing unit CU2, a parameter setting unit ADC and a set current source FCS.

The first current sensing unit CU1 is coupled to the current sensing pins CSP1 and CSN1 and the current output pin IMON, and the second current sensing unit CU2 is coupled to the current sensing pins CSP2 and CSN2 and the current output pin IMON. During the operation period of the PWM controller 2, the first current sensing unit CU1 and the second current sensing unit CU2 are used to sum the output currents of different phases and output the total current through the current output pin IMON. The current output pin IMON and the output reference pin REFOUT can be externally coupled to a thermistor NTC (e.g., a negative temperature coefficient thermistor, but not limited to this), thereby providing temperature compensation to the total current outputted by the current output pin IMON. The current output pin IMON can also be grounded through a resistor RIMON and a capacitor C coupled in series to filter out noise.

The parameter setting unit ADC is coupled to the parameter setting pin PROG; the set current source FCS is coupled between the parameter setting unit ADC and the parameter setting pin PROG. The parameter setting pin PROG can be externally coupled to an external parameter setting unit RDRP' (e.g., an external resistor, but not limited to this) and can be grounded through the external parameter setting unit RDRP' and perform parameter setting. During the initial period of the IC, the set current source FCS provides the sensed current ISEN to the parameter setting pin PROG and cooperates with the external setting resistor RDRP' to generate a set voltage VSET at the parameter setting pin PROG. The parameter setting unit ADC generates a setting signal K according to the set voltage VSET to adjust the magnification of the current mirror. It should be noted that after the IC starts operating, the setting signal K is maintained unchanged, and the set current source FCS, the parameter setting unit ADC and the external parameter setting unit RDRP' no longer function.

In this embodiment, the current mirror calibration circuit includes a first voltage generation unit 21, a second voltage generation unit 22, a calibration unit 23, a current mirror circuit 24 and a voltage follower VF2. The first voltage generation unit 21 is coupled to the current output pin IMON, the first current sensing unit CU1, the second current sensing unit CU2, the current mirror circuit 24 and the first default voltage VTRM respectively and used for providing the first default voltage VTRM during the initial period; the second voltage generation unit 22 is coupled to the current mirror circuit 24, the second default voltage VTRM and the DC-to-AC voltage VDAC and used for providing the second default voltage VTRM during the initial period, and the second default voltage VTRM is equal to the first default voltage VTRM; the calibration unit 23 is coupled to the second voltage generation unit 22, the current mirror circuit 24 and the third default voltage VREF respectively; the current mirror circuit 24 is coupled to the first voltage generation unit 21, the second voltage generation unit 22, the calibration unit 23, the voltage follower VF2, the output reference pin REFOUT and the parameter setting unit ADC; the voltage follower VF2 is coupled to the current mirror circuit 24, the third default voltage VREF and the output reference pin REFOUT respectively.

The current mirror circuit 24 includes a first current unit 241 and a second current unit 242. The first current unit 241 is used to receive the original current I0 and the second current unit 242 generates a mirror current IDRP which is proportional to the original current I0. The first current unit 241 has a first node N1, a second node N2 and a resistor R1. The resistor R1 is disposed between the first node N1 and the second node N2. The second current unit 242 has a third node N3, a fourth node N4 and an internal parameter setting unit RDRP. The internal parameter setting unit RDRP is disposed between the third node N3 and the fourth node N4. The first node N1 is coupled to the first voltage generation unit 21. The second node N2 is coupled to the third default voltage VREF. The third node N3 is coupled to the second voltage generation unit 22 and the calibration unit 23. The fourth node N4 is coupled to the calibration unit 23 and the positive input terminal + of the error amplifier EA. It should be noted that the mirror current IDRP generated by the second current unit 242 will sequentially flow through the third node N3, the internal parameter setting unit RDRP and the fourth node N4, and generate a voltage difference VDRP on the internal parameter setting unit RDRP.

During the initial period, when the first voltage generation unit 21 receives the enable signal S1, the first voltage generation unit 21 provides the first default voltage VTRM according to the enable signal S1. When the enable signal S1 is disabled, the first voltage generation unit stops providing the first default voltage VTRM. The first voltage generation unit 21 includes a switch unit 210 and a voltage follower VF1. The switch unit 210 is coupled to the output current pin IMON. The voltage follower VF1 is coupled between the first node N1 and the switch unit 210.

The switch unit 210 includes switches SW1 and SW2. The switch SW1 is coupled between the output current pin IMON and the input terminal + of the first voltage follower VF1. The switch SW2 is coupled between the first default voltage VTRM and the input terminal + of the first voltage follower VF1. The operations of the switches SW1 and SW2 are controlled by the enable signal S1 to provide the first default voltage VTRM to the input terminal + of the first voltage follower VF1.

During the initial period, the enable signal S1 controls the switch SW1 to be turned off and controls the switch SW2 to be turned on, so that the first default voltage VTRM can be inputted to the input terminal + of the first voltage follower VF1, thereby the first node N1 has the first default voltage VTRM.

During the initial period, when the second voltage generation unit 22 receives the enable signal S1, the second voltage generation unit 22 provides the second default voltage VTRM according to the enable signal S1; when the enable signal S1 is disabled, the second voltage generation unit 22 stops providing the second default voltage VTRM.

The second voltage generation unit 22 includes a third switch SW3 and a fourth switch SW4. The third switch SW3 is coupled between the DC-to-AC voltage DAC and the third node N3. The fourth switch SW4 is coupled between the second default voltage VTRM and the third node N3. The operations of the third switch SW3 and the fourth switch SW4 are controlled by the enable signal S1 to provide the second default voltage VTRM to the third node N3.

During the initial period, the enable signal S1 controls the switch SW3 to be turned off and controls the switch SW4 to be turned on, so that the second default voltage VTRM can be inputted to the third node N3, thereby the third node N3 has the second default voltage VTRM.

The correcting unit 23 is used to compare the third default voltage VREF with the reference voltage VEAP on the fourth node N4 and adjust the reference voltage VEAP to be equal to the third default voltage VREF. The calibration unit 23 can include a comparator 230 and a compensation unit 232.

The comparator 230 is coupled to the fourth node N4 and the third default voltage VREF and used to receive the reference voltage VEAP on the fourth node N4 and the third default voltage VREF respectively and compare them to provide a comparing result COM to the compensation unit 232. The compensation unit 232 is coupled to the third node N3, the fourth node N4 and the comparator 230 respectively and used to compensate the mirror current IDRP flowing through the third node N3 and the fourth node N4 according to the comparing result COM of the comparator 230.

The compensation unit 232 includes a current source CS1, a switch SW5, a current source CS2 and a switch SW6. The switch SW5 is coupled between the current source CS1 and the third node N3. The current source CS2 is coupled to the ground. The switch SW6 is coupled between the current source CS2 and the fourth node N4.

The compensation unit 232 controls the operations of the switches SW5 and SW6 according to the comparing result COM to compensate the mirror current IDRP flowing through the third node N3 and the fourth node N4. When the reference voltage VEAP is larger than the third default voltage VREF, the compensation unit 232 controls the switch SW5 to be turned off and controls the switch SW6 to be turned on according to the comparing result COM to pump current from the fourth node N4; when the reference voltage VEAP is smaller than the third default voltage VREF, the compensation unit 232 controls the switch SW5 to be turned on and controls the switch SW6 to be turned off to sink current to the third node N3.

The voltage follower VF2 has a positive input terminal +, a negative input terminal − and an output terminal H. The positive input terminal + of the voltage follower VF2 is coupled to the third default voltage VREF and the negative input terminal − of the voltage follower VF2 is coupled to the output terminal H and the second node N2 of the first current unit 241 respectively.

Figure 2:
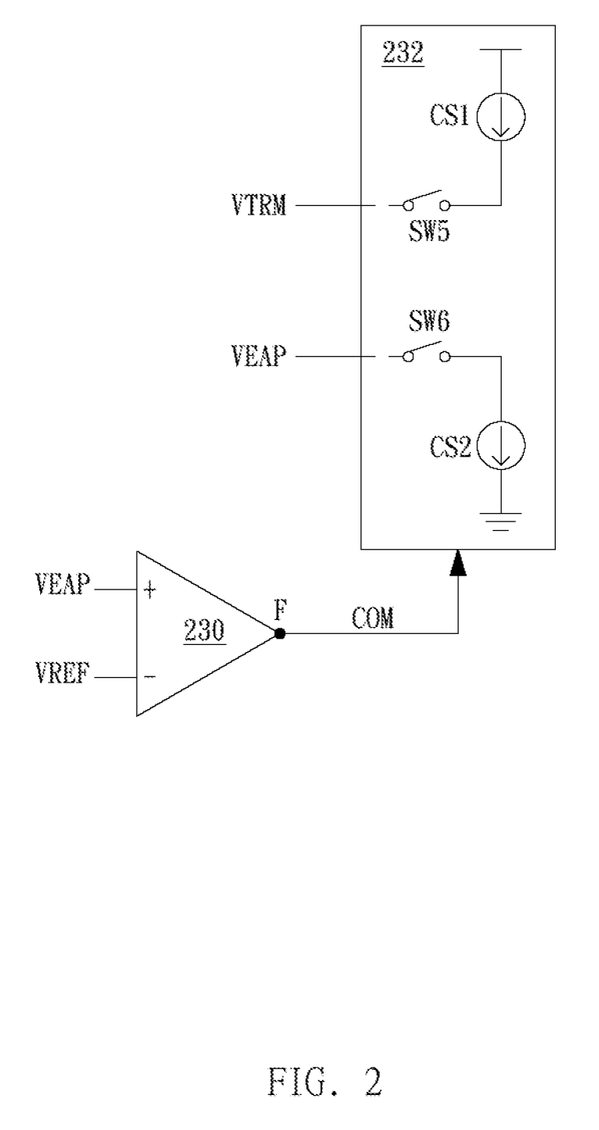
FIG. 2 illustrates a schematic diagram of the two input terminals of the comparator 230 receiving the reference voltage VEAP and the third default voltage VREF respectively and the fifth switch SW5 and the sixth switch SW6 of the compensation unit 232 being coupled to the second default voltage VTRM and the reference voltage VEAP respectively during the initial period.

Please refer to FIG. 1 and FIG. 2 simultaneously. During the initial period, the first voltage generation unit 21 provides the first default voltage VTRM to the first node N1 and the second voltage generation unit 22 provides the second default voltage VTRM to the third node N3. At this time, the magnification K of the current mirror CM has not been set, so that the default value is 1.

When the reference voltage VEAP is larger than the third default voltage VREF, it represents that the voltage difference VDRP on the internal parameter setting unit RDRP disposed between the third node N3 and the fourth node N4 is too high, the switch SW5 is controlled to be turned off and the switch SW6 is controlled to be turned on according to the comparing result COM of the comparator 230 to pump current from the fourth node N4 to lower the voltage difference VDRP on the internal parameter setting unit RDRP; when the reference voltage VEAP is smaller than the third default voltage VREF, it represents that the voltage difference VDRP on the internal parameter setting unit RDRP disposed between the third node N3 and the fourth node N4 is too low, the switch SW5 is controlled to be turned on and the switch SW6 is controlled to be turned off according to the comparing result COM of the comparator 230 to sink current to the third node N3 to increase the voltage difference VDRP on the internal parameter setting unit RDRP.

Figure 3:
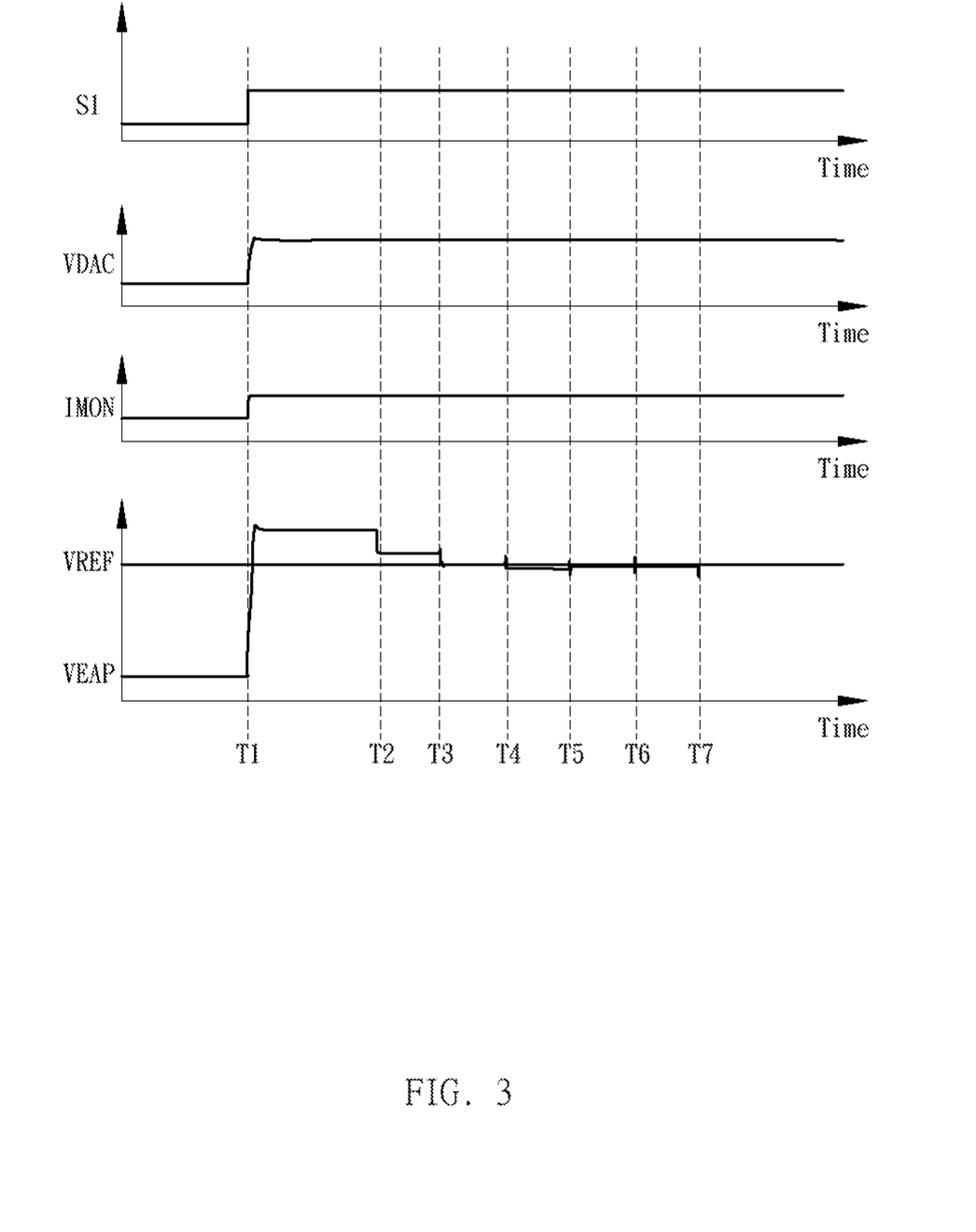
FIG. 3 illustrates timing diagrams of the enable signal S1, the DC-to-AC voltage VDAC, the voltage of the current output pin IMON, the third default voltage VREF, the reference voltage VEAP and the slop SLP.

Please refer to FIG. 3. FIG. 3 illustrates timing diagrams of the enable signal S1, the DC-to-AC voltage VDAC, the voltage of the current output pin IMON, the third default voltage VREF, the reference voltage VEAP and the slop SLP.

As shown in FIG. 3, at the time T1, the enable signal S1, the DC-to-AC voltage VDAC, and the voltage of the current output pin IMON are all changed from low-level to high-level, and the reference voltage VEAP at the fourth node N4 is also changed from low-level to high-level. The level of the reference voltage VEAP has exceeded that of the third default voltage VREF which is maintained constant.

Since the comparing result COM of the comparator 230 is that the reference voltage VEAP is larger than the third default voltage VREF, the compensation unit 232 will control the switch SW5 to be turned off and control the switch SW6 to be turned on to pump current from the fourth node N4 to lower the voltage difference VDRP on the internal parameter setting unit RDRP.

At the time T2, the enable signal S1, the DC-to-AC voltage VDAC and the voltage of the current output pin IMON are all maintained at high-level, the reference voltage VEAP at the fourth node N4 is lowered because the compensation unit 232 pumps current from the fourth node N4, but it still larger than the third default voltage VREF. Since the comparing result COM of the comparator 230 is still that the reference voltage VEAP is larger than the third default voltage VREF, the compensation unit 232 will still control the switch SW5 to be turned off and control the switch SW6 to be turned on to continuously pump current from the fourth node N4 to further lower the voltage difference VDRP on the internal parameter setting unit RDRP.

Next and so on, until the comparing result COM of the comparator 230 becomes that the reference voltage VEAP on the fourth node N4 is equal to the third default voltage VREF. At this time, the compensation unit 232 stops pumping current from the fourth node N4 and the error rate is zero.

The condition that the reference voltage VEAP is lower than the third default voltage VREF which is maintained constant is similar to the above-mentioned condition that the reference voltage VEAP is higher than the third default voltage VREF which is maintained constant, except that the compensation unit 232 will control the switch SW5 to be turned on and control the switch SW6 to be turned off to sink the current to the third node N3. Therefore, it will not be described here.

In summary, even the current mirror circuit 24 itself has an error and the output mirror current IDRP is too large or too small, the current mirror calibration circuit of the invention can perform compensation of sinking current or pumping current on the mirror current IDRP according to the comparing result between the reference voltage VEAP and the third default voltage VREF, thereby eliminating the error caused by the current mirror circuit 24, so that the mirror current IDRP can approach the ideal value.

Another embodiment of the invention is a current mirror calibration method. In this embodiment, the current mirror calibration method is used to calibrate a current mirror circuit. The current mirror circuit is coupled to an error amplifier of a PWM controller. The current mirror circuit includes a first current unit and a second current unit. The first current unit has a first node and a second node. The second current unit has a third node and a fourth node. The fourth node is coupled to an input terminal of the error amplifier.

Figure 4:
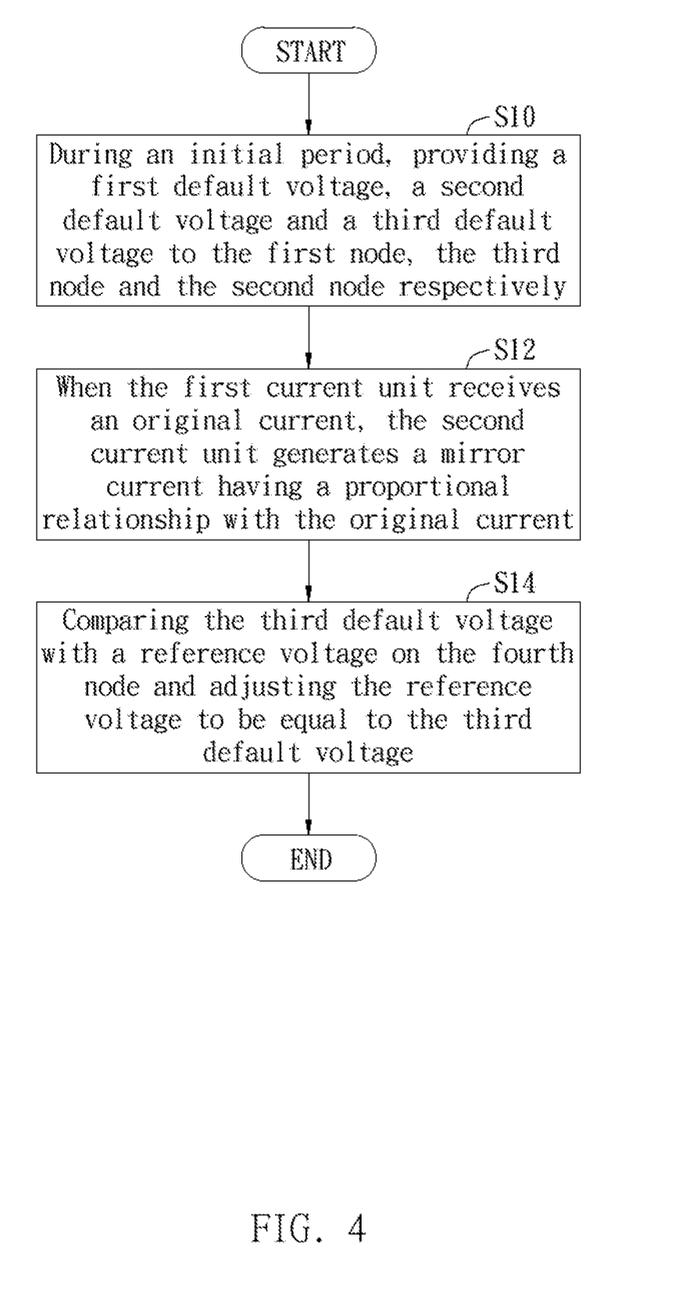
FIG. 4 illustrates a flowchart of the current mirror calibration method in another embodiment of the invention.

Please refer to FIG. 4. FIG. 4 illustrates a flowchart of the current mirror calibration method in this embodiment. As shown in FIG. 4, the current mirror calibration method can include the following steps:

Step S10: providing a first default voltage, a second default voltage and a third default voltage to the first node, the second node and the third node respectively during an initial period;

Step S12: when the first current unit receives an original current, the second current unit generating a mirror current having a proportional relationship with the original current, and the mirror current flowing through the third node and the fourth node; and Step S14: comparing the third default voltage with a reference voltage on the fourth node and adjusting the reference voltage to be equal to the third default voltage.

In practical applications, the current minor circuit can include a first resistor and an internal parameter setting unit. The first resistor is disposed between the first node and the second node and the internal parameter setting unit is disposed between the third node and the fourth node. The first default voltage is equal to the second default voltage.

Compared to the prior art, during the initial period of the IC, the current minor calibration circuit and the current mirror calibration method of the invention generate a reference voltage (e.g., the third default voltage VREF) and a reference current (e.g., the original current I0) at the input terminal of the current minor circuit (e.g., the first current unit) and generate an output voltage (e.g., the reference voltage VEAP) and an output current (e.g., the mirror current IDRP) at the output terminal of the current mirror circuit (e.g., the second current unit), and control a set of current source in the compensation unit to perform current pumping/sinking according to a comparing result between the output voltage (e.g., the reference voltage VEAP) and the reference voltage (e.g., the third default voltage VREF) until the output voltage (e.g., the reference voltage VEAP) is equal to the reference voltage (e.g., the third default voltage VREF), thereby the error caused by the current mirror circuit can be effectively eliminated to avoid providing the erroneous output voltage (e.g., the reference voltage VEAP) to the error amplifier of the PWM controller.

What is claimed is:

1. A current mirror calibration circuit, coupled to an error amplifier of a pulse-width modulation (PWM) controller, comprising:
a first voltage generation unit, configured to provide a first default voltage during an initial period;
a second voltage generation unit, configured to provide a second default voltage during the initial period;
a third default voltage;
a calibration unit; and
a current mirror circuit comprising a first current unit and a second current unit, wherein the first current unit receives an original current, the second current unit generates a mirror current having a proportional relationship with the original current, the first current unit has a first node and a second node, the second current unit has a third node and a fourth node, the first node is coupled to the first voltage generation unit, the second node is coupled to a third default voltage, the third node is coupled to the second voltage generation unit and the calibration unit, the fourth node is coupled to the calibration unit and an output terminal of the error amplifier.

2. The current mirror calibration circuit of claim 1, wherein the calibration unit compares the third default voltage with a reference voltage on the fourth node and adjusts the reference voltage to be equal to the third default voltage.

3. The current mirror calibration circuit of claim 1, wherein the first default voltage is equal to the second default voltage.

4. The current mirror calibration circuit of claim 1, wherein the current mirror circuit comprises a first resistor disposed between the first node and the second node.

5. The current mirror calibration circuit of claim 1, wherein the current mirror circuit comprises an internal parameter setting unit disposed between the third node and the fourth node.

6. The current mirror calibration circuit of claim 1, wherein the first voltage generation unit comprises a first switch unit and a first voltage follower, the first switch unit is coupled to an output current pin of the PWM controller, the first voltage follower is coupled between the first node and the first switch unit.

7. The current mirror calibration circuit of claim 6, wherein the first switch unit comprises:
a first switch, coupled between the output current pin and an input terminal of the first voltage follower; and
a second switch, coupled between the first default voltage and the input terminal of the first voltage follower,
wherein operations of the first switch and the second switch are controlled by an enable signal to provide the first default voltage to the input terminal of the first voltage follower.

8. The current mirror calibration circuit of claim 1, wherein the second voltage generation unit comprises:
a third switch, coupled between a DC-to-AC voltage and the third node; and
a fourth switch, coupled between the second default voltage and the third node,
wherein operations of the third switch and the fourth switch are controlled by an enable signal to provide the second default voltage to the third node.

9. The current mirror calibration circuit of claim 1, wherein the calibration unit comprises:
a comparator, coupled to the fourth node and the third default voltage, for comparing a reference voltage on the fourth node with the third default voltage to provide a comparing result; and
a compensation unit, coupled to the third node, the fourth node and the comparator respectively, for compensating the mirror current flowing through the third node and the fourth node according to the comparing result.

10. The current mirror calibration circuit of claim 9, wherein the compensation unit comprises:
a first current source;
a fifth switch, coupled between the first current source and the third node;
a second current source, coupled to a ground terminal; and
a sixth switch, coupled to the second current source and the fourth node,
wherein the compensation unit controls operations of the fifth switch and the sixth switch according to the comparing result to compensate the mirror current flowing through the third node and the fourth node.

11. The current mirror calibration circuit of claim 10, wherein when the comparing result is that the reference voltage is larger than the third default voltage, the fifth switch is turned off and the sixth switch is turned on to pump current from the fourth node; when the comparing result is that the reference voltage is smaller than the third default voltage, the fifth switch is turned on and the sixth switch is turned off to sink current to the third node.

12. The current mirror calibration circuit of claim 1, wherein the first voltage generation unit provides the first default voltage according to an enable signal; when the enable signal is disabled, the first voltage generation unit stops providing the first default voltage.

13. The current mirror calibration circuit of claim 1, wherein the second voltage generation unit provides the second default voltage according to an enable signal; when the enable signal is disabled, the second voltage generation unit stops providing the second default voltage.

14. A current mirror calibration method, used to calibrate a current mirror circuit, the current mirror circuit being coupled to an error amplifier of a pulse-width modulation (PWM) controller, the current mirror circuit comprising a first current unit and a second current unit, the first current unit having a first node and a second node, the second current unit having a third node and a fourth node, the fourth node being coupled to an input terminal of the error amplifier, the current mirror calibration method comprising:
during an initial period, providing a first default voltage, a second default voltage and a third default voltage to the first node, the second node and the third node respectively;
when the first current unit receives an original current, the second current unit generating a mirror current having a proportional relationship with the original current, and the mirror current flowing through the third node and the fourth node; and
comparing the third default voltage with a reference voltage on the fourth node and adjusting the reference voltage to be equal to the third default voltage.

15. The current mirror calibration method of claim 14, wherein the first default voltage is equal to the second default voltage.

16. The current mirror calibration method of claim 14, wherein the current mirror circuit further comprises a first resistor and an internal parameter setting unit, the first resistor is disposed between the first node and the second node and the internal parameter setting unit is disposed between the third node and the fourth node.

* * * * *